(12) United States Patent
Kato et al.

(10) Patent No.: US 8,917,218 B2
(45) Date of Patent: Dec. 23, 2014

(54) CIRCUIT BOARD AND CIRCUIT MODULE

(75) Inventors: Noboru Kato, Nagaokakyo (JP); Jun Sasaki, Nagaokakyo (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 439 days.

(21) Appl. No.: 13/294,310

(22) Filed: Nov. 11, 2011

(65) Prior Publication Data

US 2012/0056796 A1 Mar. 8, 2012

Related U.S. Application Data

(63) Continuation of application No. PCT/JP2010/055088, filed on Mar. 24, 2010.

(30) Foreign Application Priority Data

| May 14, 2009 | (JP) | 2009-117391 |
| Aug. 20, 2009 | (JP) | 2009-190897 |

(51) Int. Cl.

| *H01Q 7/08* | (2006.01) |
| *H01Q 1/00* | (2006.01) |
| *H05K 1/02* | (2006.01) |
| *H01Q 1/20* | (2006.01) |
| *H01L 23/66* | (2006.01) |
| *H01Q 7/00* | (2006.01) |
| *H01L 23/538* | (2006.01) |
| *H05K 1/18* | (2006.01) |
| *H05K 1/16* | (2006.01) |
| *H05K 3/46* | (2006.01) |

(52) U.S. Cl.
CPC ........ H01Q 1/20 (2013.01); *H05K 2201/10098* (2013.01); *H01L 2924/3011* (2013.01); H05K 1/0281 (2013.01); *H01L 2223/6677* (2013.01); *H05K 1/025* (2013.01); *H05K 1/189* (2013.01); *H05K 2201/09336* (2013.01); H01L 23/66 (2013.01); *H05K 2201/10189* (2013.01); *H05K 1/0243* (2013.01); H05K 1/0233 (2013.01); *H05K 1/165* (2013.01); H01Q 7/00 (2013.01); H01L 23/5387 (2013.01); *H05K 3/4632* (2013.01)
USPC ..................... 343/788; 343/787; 343/700 MS

(58) Field of Classification Search
CPC .......................... H01Q 123/5387; H01Q 1/189
See application file for complete search history.

(56) References Cited

U.S. PATENT DOCUMENTS 5,844,523 A 12/1998 Brennan et al.
7,057,563 B2 * 6/2006 Cox et al. ............... 343/700 MS
(Continued)

FOREIGN PATENT DOCUMENTS

| EP | 1 912 282 A1 | 4/2008 |
| JP | 03-064105 A | 3/1991 |

(Continued)

OTHER PUBLICATIONS

Official Communication issued in International Patent Application No. PCT/JP2010/055088, mailed on Jun. 29, 2010.

(Continued)

*Primary Examiner* — Trinh Dinh
(74) *Attorney, Agent, or Firm* — Keating & Bennett, LLP

(57) ABSTRACT

A circuit board and a circuit module more accurately provide impedance matching between an antenna coil and an electronic component electrically connected to the antenna coil, and include a board body including board portions and a plurality of laminated insulating material layers made of a flexible material. An antenna coil includes coil conductors provided in the board portion. Wiring conductors are provided in the board portion and electrically connected to the antenna coil. The board portion has a structure that is less likely to deform than the board portion. An integrated circuit electrically connected to the wiring conductors is mounted on the board portion.

8 Claims, 6 Drawing Sheets

(56) References Cited

U.S. PATENT DOCUMENTS

| | | | |
|---|---|---|---|
| 7,126,547 B2* | 10/2006 | Kim et al. | 343/702 |
| 7,495,618 B2* | 2/2009 | Kurashima et al. | 343/700 MS |
| 8,604,992 B2* | 12/2013 | Kobayashi et al. | 343/788 |
| 2007/0164867 A1* | 7/2007 | Kawai | 340/572.7 |
| 2008/0191174 A1* | 8/2008 | Ehrensvard et al. | 252/500 |
| 2009/0033567 A1* | 2/2009 | Takeuchi | 343/702 |
| 2010/0038437 A1 | 2/2010 | Kato et al. | |
| 2010/0052996 A1 | 3/2010 | Ochi et al. | |
| 2012/0280867 A1* | 11/2012 | Baek et al. | 343/700 MS |

FOREIGN PATENT DOCUMENTS

| | | |
|---|---|---|
| JP | 7-335443 A | 12/1995 |
| JP | 2000-506329 A | 5/2000 |
| WO | 2007/015353 A1 | 2/2007 |
| WO | 2007/015406 A1 | 2/2007 |
| WO | 2008/140037 A1 | 11/2008 |

OTHER PUBLICATIONS

Official Communication issued in corresponding Japanese Patent Application No. 2014-027681, mailed on Oct. 28, 2014.

* cited by examiner

CIRCUIT BOARD AND CIRCUIT MODULE

BACKGROUND OF THE INVENTION

1. Field of the Invention

The present invention relates to a circuit board and a circuit module, and more specifically, relates to a circuit board and a circuit module each including an antenna coil.

2. Description of the Related Art

As an existing circuit board, for example, the flexible sheet described in International Publication No. 2007/015353 is known. Hereinafter, the flexible sheet will be described with reference to the drawing. FIG. 7 is a configuration diagram of the flexible sheet 500 described in International Publication No. 2007/015353.

As shown in FIG. 7, the flexible sheet 500 is one sheet formed from a flexible material, and is composed of coil pattern portions 500a to 500d and a mounting portion 501. Coil conductors 502a to 502d are provided on the pattern portions 500a to 500d, respectively. The coil conductors 502a to 502d constitute an antenna coil.

Further, a hard circuit board 600 is mounted on the mounting portion 501. Moreover, a semiconductor element 602 that performs a communication function for transmitting and receiving signals via the antenna coil to and from an external device is mounted on the circuit board 600. The flexible sheet 500 described above is mounted in an electronic device or the like in a state of being bent at dotted lines L1 to L4 (the dotted line L3 is indicated as a solid line since it overlaps the circuit board 600) in FIG. 7 and folded in a compact form. The flexible sheet 500 performs non-contact communication with an external device via the antenna coil to exchange signals.

Meanwhile, as described below, the flexible sheet 500 has a problem in that it is difficult to provide impedance matching between the semiconductor element 602 and the antenna coil, which is composed of the coil conductors 502a to 502d. Specifically, in the flexible sheet 500, the antenna coil is formed on the flexible sheet 500. The semiconductor element 602 is mounted on the circuit board 600 mounted on the flexible sheet 500. Thus, between the antenna coil and the circuit board 600, there are two connection portions, namely, a connection portion between the flexible sheet 500 and the circuit board 600 and a connection portion between the circuit board 600 and the semiconductor element 602. At the connection portions, a wiring width changes, and hence impedance matching is likely to deteriorate. Thus, in the flexible sheet 500, in order to provide impedance matching between the antenna coil and the semiconductor element 602, it is desired to reduce the number of the connection portions.

SUMMARY OF THE INVENTION

Therefore, preferred embodiments of the present invention provide a circuit board and a circuit module that can more accurately provide impedance matching between an antenna coil and an electronic component electrically connected to the antenna coil.

A circuit board according to a preferred embodiment of the present invention includes a board body including a first board portion and a second board portion and also including a plurality of laminated insulating material layers made of a flexible material; an antenna coil including coil conductors provided on the insulating material layers in the first board portion; and wiring conductors provided on the insulating material layers in the second board portion and electrically connected to the antenna coil. The second board portion has a structure that is less likely to deform than the first board portion. An electronic component is mounted on the second board portion so as to be electrically connected to the wiring conductors.

A circuit module according to another preferred embodiment of the present invention includes a board body including a first board portion and a second board portion and also including a plurality of laminated insulating material layers made of a flexible material; an antenna coil including coil conductors provided on the insulating material layers in the first board portion; wiring conductors provided on the insulating material layers in the second board portion and electrically connected to the antenna coil; and an electronic component mounted on the second board portion in a state of being electrically connected to the wiring conductors. The second board portion has a structure that is less likely to deform than the first board portion.

According to various preferred embodiments of the present invention, impedance matching can more accurately be provided between an antenna coil and an electronic component electrically connected to the antenna coil.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a circuit board and a circuit module according to preferred embodiments of the present invention will be described with reference to the drawings.

Figure 1A:
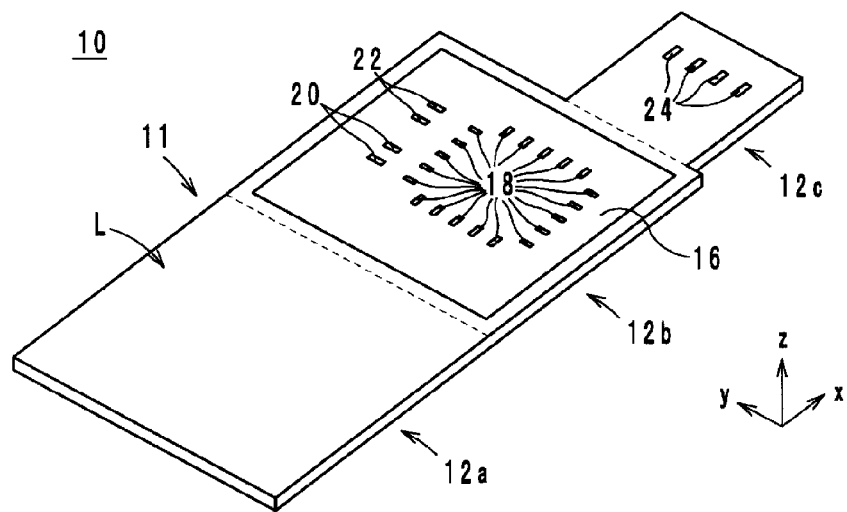
FIGS. 1A and 1B are external perspective views of a circuit board according to a preferred embodiment of the present invention.
Figure 1B:
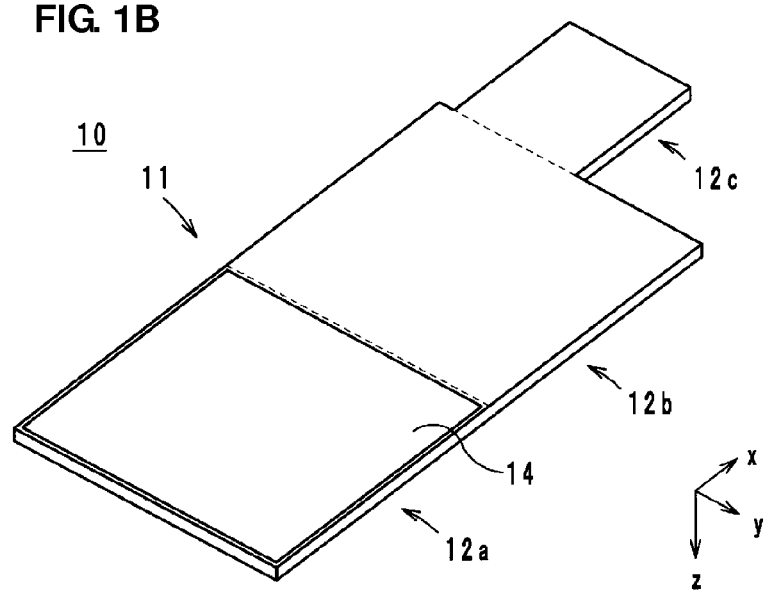
Figure 2:
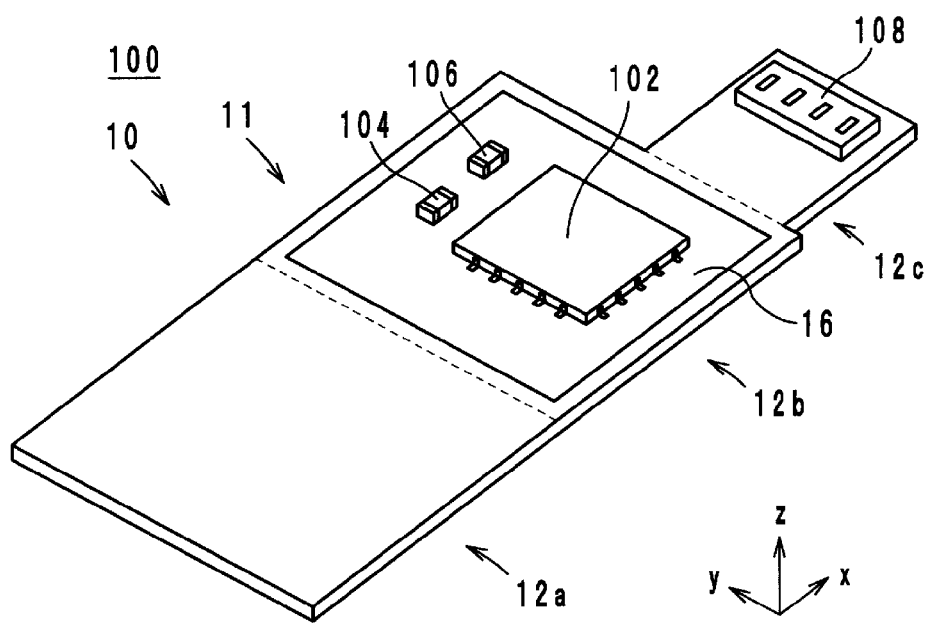
FIG. 2 is an external perspective view of a circuit module that includes the circuit board in FIGS. 1A and 1B.
Figure 3:
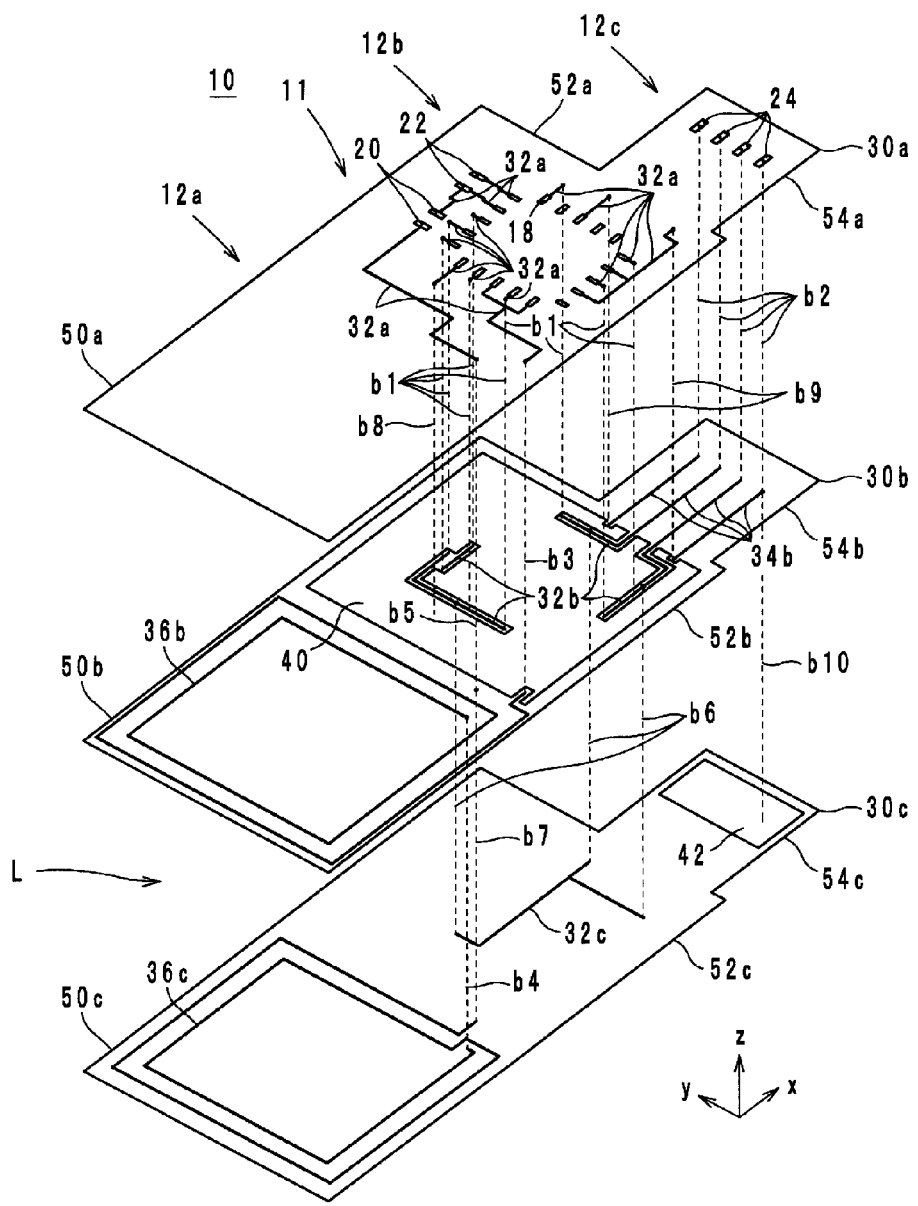
FIG. 3 is an exploded perspective view of the circuit board in FIGS. 1A and 1B.
Figure 4:
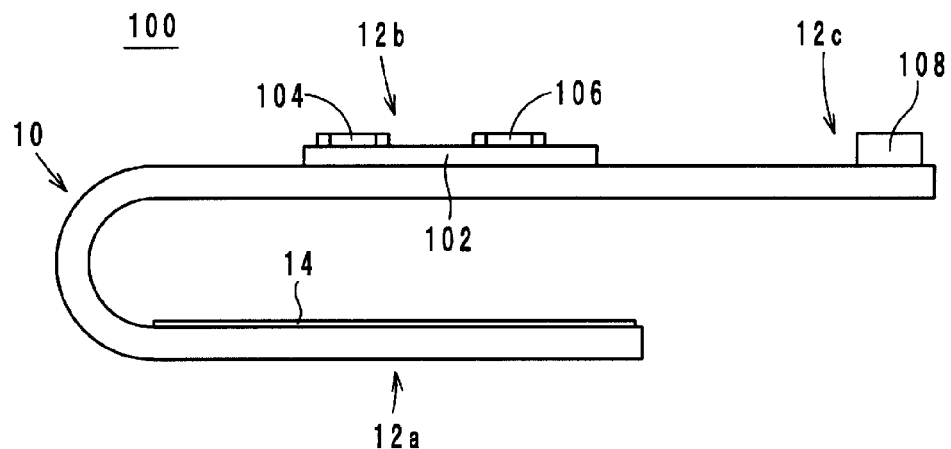
FIG. 4 is a diagram illustrating a state where the circuit module in FIG. 2 is mounted in an electronic device.

Hereinafter, a circuit board and a circuit module according to various preferred embodiments of the present invention will be described with reference to the drawings. FIGS. 1A and 1B are external perspective views of a circuit board 10 according to a preferred embodiment of the present invention. FIG. 2 is an external perspective view of a circuit module 100 that includes the circuit board 10 in FIGS. 1A and 1B. FIG. 3 is an exploded perspective view of the circuit board 10 in FIGS. 1A and 1B. FIG. 4 is a diagram illustrating the circuit module 100 in FIG. 2 is mounted in an electronic device. Hereinafter, a direction in which insulating material layers are laminated when producing the circuit board 10 is defined as a lamination direction. The lamination direction is defined as a z-axis direction, and a longitudinal direction of the circuit board 10 is defined as an x-axis direction. In addition, a direction perpendicular to the x-axis direction and the z-axis direction is defined as a y-axis direction.

As shown in FIGS. 1A and 1B, the circuit board 10 includes a board body 11. The board body 11 includes board portions 12 (12a to 12c). The board portion 12a preferably has a rectangular or substantially rectangular shape and includes an antenna coil L. In addition, a magnetic material layer 14 is provided on a principal surface (back surface) of the board portion 12a on a negative direction side in the z-axis direction.

The board portion 12b preferably has a rectangular or substantially rectangular shape, and has, in a principal surface (front surface) thereof on a positive direction side in the z-axis direction, a mounting surface on which an integrated circuit (electronic component) 102 and chip elements (electronic components) 104 and 106 are mounted as shown in FIG. 2. The board portion 12a and the board portion 12b together define a rectangle having long sides in the x-axis direction. In FIGS. 1A and 1B and 2, the boundary between the board portions 12a and 12b is indicated by a dotted line.

The board portion 12c preferably has a rectangular or substantially rectangular shape smaller than those of the board portions 12a and 12b, and includes, in a principal surface (front surface) thereof on the positive direction side in the z-axis direction, a mounting surface on which a connector (electronic component) 108 is mounted as shown in FIG. 2. The board portion 12c is provided on a positive direction side in the x-axis direction with respect to the board portion 12b.

As shown in FIG. 3, the board body 11 preferably includes a plurality (for example, three in FIG. 3) of laminated insulating material layers 30 (30a to 30c) made of a flexible material (e.g., a thermoplastic resin such as a liquid crystal polymer). Hereinafter, a principal surface of the insulating material layer 30 on the positive direction side in the z-axis direction is referred to as a front surface, and a principal surface of the insulating material layer 30 on the negative direction side in the z-axis direction is referred to as a back surface.

First, the board portion 12a will be described. As shown in FIG. 3, the board portion 12a preferably includes laminated board portion layers 50 (50a to 50c) of the insulating material layers 30 (30a to 30c). In addition, as shown in FIGS. 1A to 3, the antenna coil L and the magnetic material layer 14 are provided in the board portion 12a.

The antenna coil L radiates high-frequency signals as radio waves to the outside of the circuit board 10 and receives radio waves from the outside of the circuit board 10. As shown in FIG. 3, the antenna coil L preferably has a spiral shape and preferably includes coil conductors 36b and 36c and a via-hole conductor b4.

The coil conductor 36b has a spiral shape extending toward the center while turning clockwise, when being seen in a planar view from the positive direction side in the z-axis direction. The coil conductor 36b is provided on the front surface of the board portion layer 50b. The coil conductor 36c has a spiral shape extending toward the center while turning counterclockwise, when being seen in a planar view from the positive direction in the z-axis direction. The coil conductor 36c is provided on the front surface of the board portion layer 50c. The via-hole conductor b4 is arranged to extend through the board portion layer 50b in the z-axis direction and connects an end of the coil conductor 36c that is close to the center, to an end of the coil conductor 36c that is close to the center.

The magnetic material layer 14 is preferably made of a resin containing magnetic material powder, and is arranged on the back surface of the board portion 12a so as to cover substantially the entirety thereof. The magnetic material layer 14 prevents leakage of a magnetic flux generated by the antenna coil L, to the negative direction side in the z-axis direction with respect to the circuit board 10. Preferably, the magnetic material layer 14 has flexibility but is less likely to deform than a sheet made of the flexible material used for the insulating material layers 30 of the board portion 12a, in order to make the board portion 12a less likely to deform due to the magnetic material layer 14. Preferably, the magnetic material layer 14 is thicker than the insulating material layers 30.

Next, the board portion 12b will be described. The board portion 12b preferably includes laminated board portion layers 52 (52a to 52c) of the insulating material layers 30 (30a to 30c). In addition, as shown in FIGS. 1A to 3, a resist film 16 (omitted in FIG. 3), external electrodes 18, 20, and 22, wiring conductors 32 (32a to 32c), a ground conductor 40, and via-hole conductors b1, b3, and b5 to b9 are provided in the board portion 12b.

The external electrodes 18 are electrodes on which the integrated circuit 102 in FIG. 2 is mounted via solder or the like, and include a plurality of electrodes provided on the front surface of the board portion layer 52a so as to be arranged to define a rectangular shape as shown in FIG. 3. The external electrodes 20 and 22 are electrodes on which the chip elements 104 and 106 in FIG. 2 are mounted, respectively, and each include two electrodes provided on the front surface of the board portion layer 52a so as to be spaced apart from each other at a predetermined interval.

The wiring conductors 32a to 32c are line conductors provided on the front surfaces of the board portion layers 52a to 52c, respectively. In addition, the wiring conductors 32a are connected to any of the external electrodes 18, 20, and 22. The via-hole conductors b1 extend through the board portion layer 52a in the z-axis direction and connect the wiring conductors 32a to the wiring conductors 32b. The via-hole conductors b6 extend through the board portion layer 52b in the z-axis direction and connect the wiring conductors 32b to the wiring conductor 32c.

Further, the via-hole conductor b3 extends through the board portion layer 52a in the z-axis direction and connects the wiring conductor 32a to the coil conductor 36b. The via-hole conductors b5 and b7 extend through the board portion layers 52b and 52c, respectively, in the z-axis direction and are connected to each other to connect the wiring conductor 32a to the coil conductor 36c. As described above, the antenna coil L is electrically connected to the integrated circuit 102 and the chip elements 104 and 106 via the wiring conductors 32a to 32c and the via-hole conductors b1 and b3 to b7 as shown in FIG. 3.

The ground conductor 40 is arranged so as to cover substantially the entirety of the front surface of the board portion layer 52b, and a ground potential is applied thereto. The ground conductor 40 preferably is produced from a harder material than the insulating material layers 30 and hence is less likely to be bent than the insulating material layers 30. Thus, the board portion 12b has a structure that is less likely to deform than the board portion 12a, since the ground conductor 40 is provided therein. Moreover, in order to prevent the ground conductor 40 from being short-circuited to the wiring conductors 32b, the ground conductor 40 is not provided around the wiring conductors 32b. The ground conductor 40 described above is connected to the wiring conductor 32a via the via-hole conductor b8 extending through the board portion layer 52a in the z-axis direction.

The via-hole conductors b9 extend through the board portion layer 52a in the z-axis direction and connect the wiring conductors 32a to wiring conductors 34b (described in detail below).

Next, the board portion 12c will be described. The board portion 12c preferably includes laminated board portion layers 54 (54a to 54c) of the insulating material layers 30 (30a to 30c). In addition, as shown in FIGS. 1A to 3, external electrodes 24, the wiring conductors 34b, a ground conductor 42, and via-hole conductors b2 and b10 are provided in the board portion 12c.

The external electrodes 24 are electrodes on which the connector 108 in FIG. 2 is mounted via solder, and include four electrodes arranged on the front surface of the board portion layer 52a so as to be aligned in the y-axis direction as shown in FIG. 3.

The wiring conductors 34b are line conductors provided on the front surface of the board portion layer 54b, and extending in the x-axis direction. Each wiring conductor 34b is connected to the wiring conductor 32b or the via-hole conductor b9.

The via-hole conductors b2 extend through the board portion layer 54a in the z-axis direction and connect the external electrodes 24 to the wiring conductors 34b. Thus, the connector 108 is electrically connected to the integrated circuit 102 via the wiring conductors 32a, 32b, and 34b and the via-hole conductors b2 and b9.

The ground conductor 42 is arranged so as to cover a portion of the front surface of the board portion layer 54c, and the ground potential is applied thereto. Specifically, the ground conductor 42 preferably includes a region in which the connector 108 in FIG. 2 is provided, when being seen in a planar view from the z-axis direction. The ground conductor 42 is not provided in a region in which the wiring conductors 34b are provided, when being seen in a planar view from the z-axis direction. The ground conductor 42 preferably is produced from a harder material than the insulating material layers 30 and hence is less likely to be bent than the insulating material layers 30. Thus, a portion of the board portion 12c has a structure that is less likely to deform than the board portion 12a, since the ground conductor 42 is provided therein. The ground conductor 42 described above is connected to the wiring conductor 34b via the via-hole conductor b10 extending through the board portion layer 54b in the z-axis direction.

In the circuit board 10, as shown in FIG. 2, the integrated circuit 102 and the chip elements 104 and 106 are mounted on the external electrodes 18, 20, and 22, respectively, on the front surface of the board portion 12b. Thus, the integrated circuit 102 and the chip elements 104 and 106 are electrically connected to the wiring conductors 32a to 32c. In addition, the connector 108 is mounted on the external electrodes 24 on the front surface of the board portion 12c. Thus, the connector 108 is electrically connected to the wiring conductors 34b. As described above, the circuit board 10, the integrated circuit 102, the chip elements 104 and 106, and the connector 108 constitute the circuit module 100. The integrated circuit 102 is, for example, a circuit that processes transmission and reception signals of the antenna coil L. In addition, each of the chip elements 104 and 106 is, for example, a capacitor, a coil, or a noise filter including them.

The circuit module 100 constructed as described above is preferably bent in a U shape and used as shown in FIG. 4. Specifically, the circuit module 100 is bent in a U shape at the boundary between the board portions 12a and 12b such that the front surface of the board body 11 defines an outer peripheral surface and the back surface of the board body 11 defines an inner peripheral surface. Thus, the magnetic material layer 14 is located between the board portions 12a and 12b.

It should be noted that when seen in a planar view from the z-axis direction, the boundary between the boards 12a and 12b in the circuit board 10 is a straight line passing through a third region sandwiched between a first region in which the antenna coil L has a spiral shape and a second region in which the ground conductor 40 is provided. In the present preferred embodiment, when being seen in a planar view from the z-axis direction, the boundary between the boards 12a and 12b is a straight line located midway between a side, on a negative direction side in the x-axis direction, of the region in which the antenna coil L has a spiral shape and a side of the ground conductor 40 on the positive direction side in the x-axis direction.

Hereinafter, a method for manufacturing the circuit board 10 will be described with reference to the drawings. Hereinafter, the case where one circuit board 10 is produced will be described as an example. However, in reality, a plurality of circuit boards 10 may preferably be simultaneously produced by laminating and cutting large insulating material layers 30 (flexible sheets).

First, insulating material layers 30 having copper foil formed on the entireties of the front surfaces thereof are prepared. Next, a laser beam is applied from the back surface side to locations (see FIG. 3) in the insulating material layers 30a and 30b where the via-hole conductors b1 to b10 are to be formed, to form via holes.

Next, the external electrodes 18, 20, 22, and 24 and the wiring conductors 32a shown in FIG. 3 are formed on the front surface of the insulating material layer 30a by a photolithographic process. Specifically, resists having the same shapes as those of the external electrodes 18, 20, 22, and 24 and the wiring conductors 32a shown in FIG. 3 are printed on the copper foil of the insulating material layer 30a. Then, etching treatment is performed on the copper foil to remove the portion of the copper foil that is not covered with the resists. Then, the resists are removed. By so doing, the external electrodes 18, 20, 22, and 24 and the wiring conductors 32a are formed on the front surface of the insulating material layer 30a as shown in FIG. 3. Further, a resin is applied to the front surface of the insulating material layer 30a to form the resist film 16 shown in FIGS. 1A and 1B.

Next, the wiring conductors 32b and 34b, the coil conductor 36b, and the ground conductor 40 shown in FIG. 3 are formed on the front surface of the insulating material layer 30b by a photolithographic process, for example. Further, the wiring conductor 32c, the coil conductor 36c, and the ground conductor shown in FIG. 3 are formed on the front surface of the insulating material layer 30c by a photolithographic process, for example. These photolithographic processes are preferably the same as the photolithographic process performed when forming the external electrodes 18, 20, 22, and 24 and the wiring conductors 32a, and thus the description thereof is omitted.

Next, the via holes formed in the insulating material layers 30a and 30b are filled with a conductive paste containing copper as a principal component, to form the via-hole conductors b1 to b10 shown in FIG. 3.

Next, the insulating material layers 30a to 30c are stacked in order. Then, forces are applied to the insulating material layers 30a to 30c from upper and lower directions in the lamination direction, to pressure-bond the insulating material layers 30a to 30c. By so doing, the circuit board 10 shown in FIGS. 1A and 1B is obtained.

Figure 7:
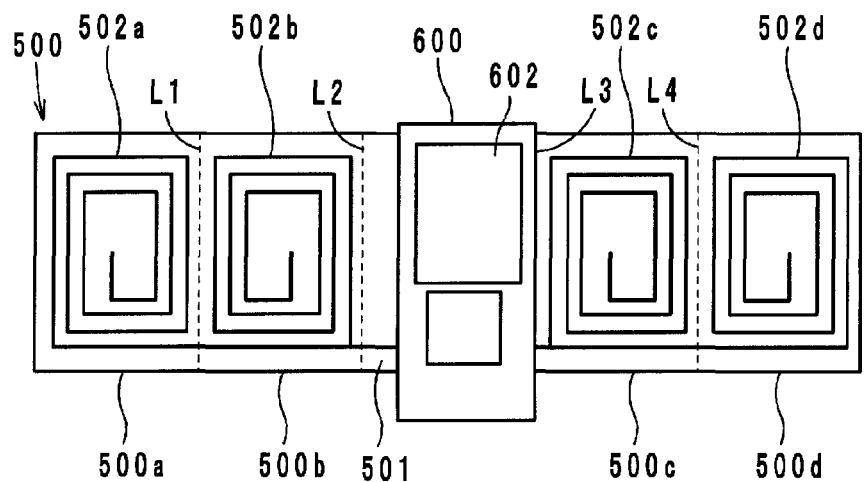
FIG. 7 is a configuration diagram of the flexible sheet described in International Publication No. 2007/015353.

According to the circuit board 10 and the circuit module 100 described above, impedance matching can more accurately be achieved between the antenna coil L and the integrated circuit 102. Specifically, in the existing flexible sheet 500 shown in FIG. 7, the antenna coil is formed on the flexible sheet 500. The semiconductor element 602 is mounted on the circuit board 600 mounted on the flexible sheet 500. Thus, between the antenna coil and the circuit board 600, there are two connection portions, namely, the connection portion between the flexible sheet 500 and the circuit board 600 and the connection portion between the circuit board 600 and the semiconductor element 602. At the connection portions, a wiring width changes, and hence impedance matching is likely to deteriorate. Thus, in the flexible sheet 500, between the antenna coil and the semiconductor element 602, impedance matching may greatly deteriorate at the two portions.

For that reason, in the circuit board 10, the integrated circuit 102 is allowed to be mounted directly on the circuit board 10 without using a board that is as hard as the circuit board 600. Specifically, in the circuit board 10, the ground conductor 40 is provided in the board portion 12b on which the integrated circuit 102 is mounted. Due to this, the board portion 12b has a structure that is less likely to deform than the board portion 12a. Thus, in the circuit board 10, the integrated circuit 102 is allowed to be mounted directly on the board portion 12b. Due to this, between the antenna coil L and the integrated circuit, there is only one connection portion. Therefore, in the circuit board 10, it is possible to more accurately provide impedance matching between the antenna coil L and the integrated circuit 102 than in the flexible sheet 500.

Further, in the circuit board 10, the board body 11 preferably includes the laminated insulating material layers 30 made of a flexible material. Thus, it is possible to relatively easily bend the region other than the regions in which the ground conductors 40 and 42 are provided. Therefore, similarly to the flexible sheet 500, the board body 11 is allowed to be bent and folded in a compact form.

Further, the characteristics of the antenna coil L do not greatly change even when the board portion 12a is slightly bent. Thus, the circuit board 10 has a structure in which it is easy to bend the board portion 12a, whereby the circuit board 10 is allowed to easily be mounted to a housing of an electronic device.

Further, in the circuit board 10, the insulating material layers 30 are preferably produced from a liquid crystal polymer. The liquid crystal polymer has lower hygroscopicity than ceramic materials such as epoxy glass. Thus, the circuit board 10 can prevent deformation caused by moisture absorption as compared to a circuit board produced from a ceramic material such as epoxy glass. As a result, the circuit board 10 can prevent changes in characteristics of the antenna coil L caused by deformation of the board body 11.

Further, in the circuit board 10, as described below, since the magnetic material layer 14 is provided, shifting of the resonant frequency of the antenna coil L can be prevented. Specifically, if the magnetic material layer 14 is not provided, when the board body 11 is bent as shown in FIG. 4, a magnetic flux generated by the antenna coil L in the board portion 12a reaches the board portion 12b. Thus, when the magnetic flux passes through the wiring conductors 32a to 32c in the board portion 12b, an eddy current occurs at the wiring conductors 23a to 32c. When the eddy current occurs, a magnetic flux occurs in a direction in which the magnetic flux generated by the antenna coil L is disturbed. Thus, the inductance value of the antenna coil L decreases. As a result, the resonant frequency of the antenna coil L shifts.

Thus, in the circuit board 10, as shown in FIG. 4, when the board body 11 is bent, the magnetic material layer 14 is located between the board portions 12a and 12b. Due to this, the magnetic flux generated by the antenna coil L is confined in the magnetic material layer 14, and the magnetic flux is prevented from reaching to the board portion 12b. As a result, a decrease of the inductance value of the antenna coil L is prevented, and a shift of the resonant frequency of the antenna coil L is prevented.

Figure 5:
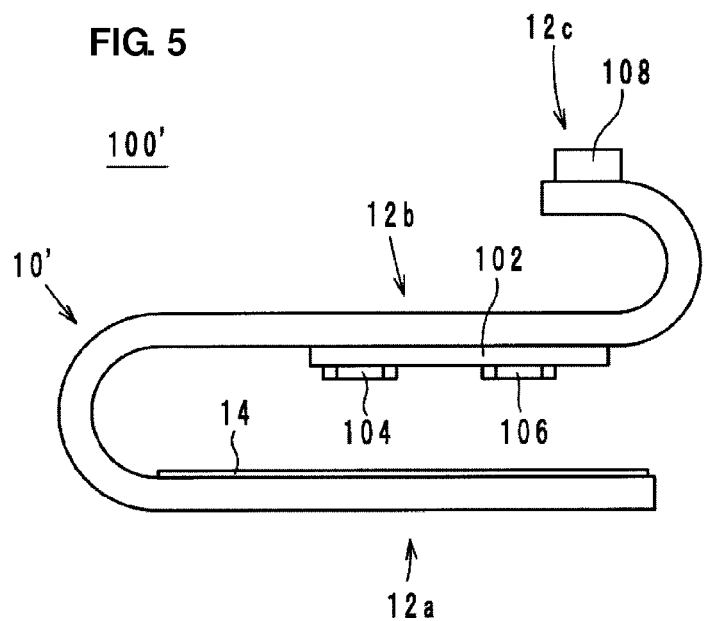
FIG. 5 is a diagram illustrating a state where a circuit module according to a modified example is mounted in an electronic device.

Hereinafter, a circuit board and a circuit module according to modified examples of preferred embodiments will be described with reference to the drawings. FIG. 5 is a diagram illustrating a state where a circuit module 100' according to a modified example is mounted in an electronic device.

As shown in FIG. 4, the circuit module 100 is bent at the boundary between the board portions 12a and 12b once and used. Meanwhile, as shown in FIG. 5, the circuit module 100' is bent at the boundary between the board portions 12a and 12b and at the boundary between the board portions 12b and 12c twice and used, and is formed in an S shape. Due to this, the circuit module 100' becomes compact in an xy plane as compared to the circuit module 100.

In the circuit module 100', the magnetic material layer 14 is provided on the front surface of the board portion 12a in order to locate the magnetic material layer 14 between the board portions 12a and 12b. The other structure of the circuit module 100' is the same as that of the circuit module 100, and thus the description thereof is omitted.

Figure 6A:
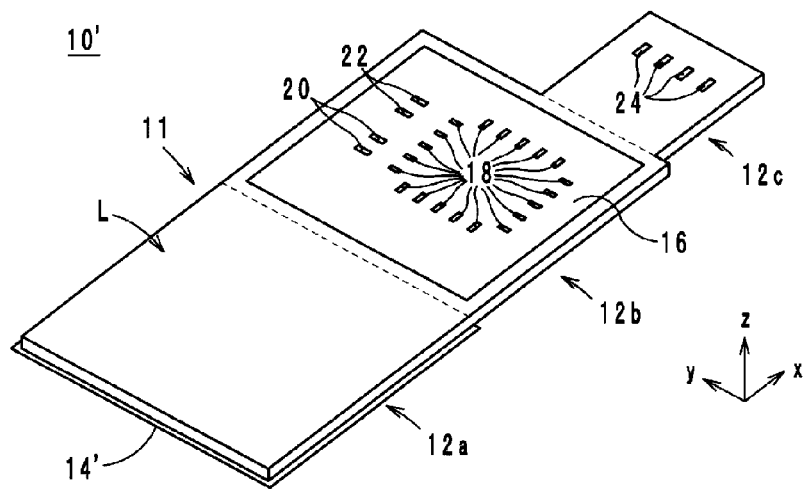
FIGS. 6A and 6B are external perspective views of a circuit board according to a modified example.
Figure 6B:
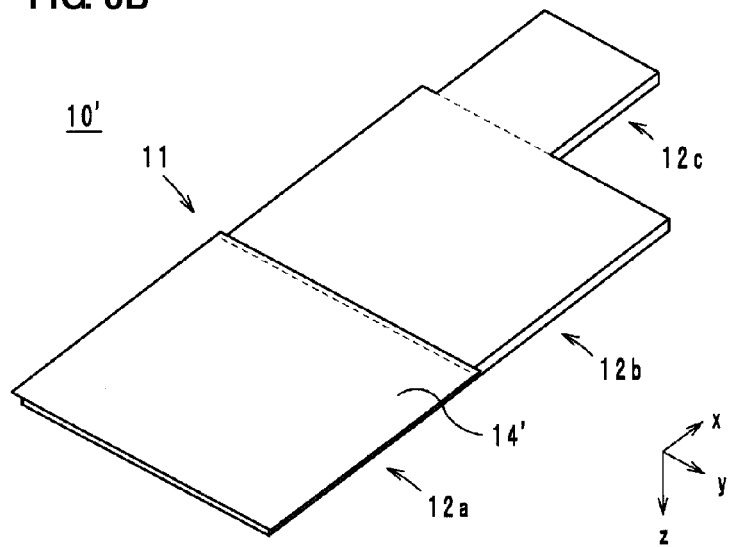

Next, a circuit board 10' according to a second modified example of preferred embodiments of the present invention will be described with reference to the drawing. FIGS. 6A and 6B are external perspective views of the circuit board 10' according to the second modified example.

A magnetic material layer 14' shown in FIGS. 6A and 6B has a larger area than that of the board portion 12a so as to cover the boundary between the board portions 12a and 12b. The magnetic material layer 14' is a sheet-shaped member obtained by dispersing magnetic material powder such as ferrite in a resin, and can also serve as a reinforcing member to reinforce the board portion 12a and the boundary between the board portions 12a and 12b, the board portion 12a having a flexibility. Thus, since the magnetic material layer 14' is arranged so as to cover the boundary between the board portions 12a and 12b to which stress is repeatedly applied due to bending or the like, breakage at the boundary between the board portions 12a and 12b is prevented. In addition, since the magnetic material layer 14' has a larger area than that of the board portion 12a so as to cover the boundary between the board portions 12a and 12b, for example, even when the circuit board 10' is bent similarly as in FIG. 4, a magnetic flux generated by the antenna coil L is assuredly confined in the magnetic material layer 14'. As a result, reach of the magnetic flux generated by the antenna coil L, to the board portion 12b is further prevented, and thus the characteristics of the antenna coil L are even more significantly improved.

Preferred embodiments of the present invention are applicable to circuit boards and circuit modules, in particular, useful for signal lines and a method for manufacturing the same, and in particular, excellent in being able to more accurately provide impedance matching between an antenna coil and an electronic component electrically connected to the antenna coil.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a board body including a first board portion and a second board portion and including a plurality of laminated insulating material layers made of a flexible material;

an antenna coil including coil conductors provided on the insulating material layers in the first board portion;

wiring conductors provided on the insulating material layers in the second board portion and electrically connected to the antenna coil; and a magnetic material layer including a magnetic material; wherein the second board portion has a structure that deforms less than the first board portion;

an electronic component is mounted on the second board portion so as to be electrically connected to the wiring conductors;

the board body is bent in a U shape at a boundary between the first board portion and the second board portion; and the magnetic material layer is located between the first board portion and the second board portion.

2. The circuit board according to claim 1, further comprising an inner conductor provided in the second board portion such that the second board portion has the structure that deforms less than the first board portion.

3. The circuit board according to claim 2, wherein the inner conductor is a ground conductor.

4. The circuit board according to claim 1, wherein the magnetic material layer is provided on a principal surface of the first board portion.

5. The circuit board according to claim 4, wherein the magnetic material layer is provided on a principal surface of the board body, and the electronic component is mounted on another principal surface of the board body.

6. The circuit board according to claim 5, wherein the board body is bent at the boundary between the first board portion and the second board portion such that the principal surface of the board body defines an outer peripheral surface.

7. A circuit module comprising:

a board body including a first board portion and a second board portion and including a plurality of laminated insulating material layers made of a flexible material;

an antenna coil including coil conductors provided on the insulating material layers in the first board portion;

wiring conductors provided on the insulating material layers in the second board portion and electrically connected to the antenna coil;

an electronic component mounted on the second board portion in a state of being electrically connected to the wiring conductors; and a magnetic material layer including a magnetic material; wherein the second board portion has a structure that deforms less than the first board portion;

the board body is bent in a U shape at a boundary between the first board portion and the second board portion; and the magnetic material layer is located between the first board portion and the second board portion.

8. The circuit module according to claim 7, wherein the electronic component is a circuit that processes transmission and reception signals of the antenna coil.

* * * * *